United States Patent
Ochi

(10) Patent No.: US 7,567,484 B2
(45) Date of Patent: Jul. 28, 2009

(54) METHOD OF PREVENTING DIELECTRIC BREAKDOWN OF SEMICONDUCTOR DEVICE AND SEMICONDUCTOR DEVICE PREVENTING DIELECTRIC BREAKDOWN

(75) Inventor: Tsuneo Ochi, Mihama-ku (JP)

(73) Assignee: Kawasaki Microelectronics, Inc., Chiba (JP)

( * ) Notice: Subject to any disclaimer, the term of this patent is extended or adjusted under 35 U.S.C. 154(b) by 171 days.

(21) Appl. No.: 11/790,035

(22) Filed: Apr. 23, 2007

(65) Prior Publication Data

US 2007/0253276 A1 Nov. 1, 2007

(30) Foreign Application Priority Data

Apr. 28, 2006 (JP) ............................. 2006-126104

(51) Int. Cl.
*G11C 8/00* (2006.01)
(52) U.S. Cl. .............................. 365/233.1; 365/185.27; 365/210.1; 365/233.12
(58) Field of Classification Search ............ 365/210.15, 365/180, 210.1, 233.1, 185.27, 233.12
See application file for complete search history.

(56) References Cited

U.S. PATENT DOCUMENTS

| 6,861,755 | B2 * | 3/2005 | Hosoda et al. ............... 257/758 |
| 7,211,897 | B2 * | 5/2007 | Yamanoue et al. .......... 257/758 |
| 2006/0145347 | A1 * | 7/2006 | Aida ........................... 257/758 |

FOREIGN PATENT DOCUMENTS

| JP | A 4-162649 | 6/1992 |
| JP | A 8-111419 | 4/1996 |
| JP | A 10-199883 | 7/1998 |
| JP | A 11-233777 | 8/1999 |
| JP | A 2000-311964 | 11/2000 |
| JP | A 2001-044277 | 2/2001 |
| JP | A 2002-343839 | 11/2002 |
| JP | A 2003-338504 | 11/2003 |
| JP | A 2004-253555 | 9/2004 |
| JP | A 2005-251829 | 9/2005 |
| JP | A 2006-190839 | 7/2006 |
| JP | A 2006-261613 | 9/2006 |
| JP | A 2006-332344 | 12/2006 |
| JP | A 2006-344862 | 12/2006 |

* cited by examiner

*Primary Examiner*—Pho M. Luu
(74) *Attorney, Agent, or Firm*—Oliff & Berridge, PLC

(57) ABSTRACT

A semiconductor device that prevents a build-up of electrostatic charge in a dummy pad is provided. The semiconductor device may contain an internal circuit formed on a semiconductor substrate and the dummy pad which is not electrically connected to the internal circuit. The semiconductor device may further include a seal ring that surrounds the internal circuit and the dummy pad, where the seal ring is electrically connected to the semiconductor substrate and includes a pattern in a first metal layer, a contact between the pattern in the first metal layer and the semiconductor substrate, patterns in upper metal layers stacked above the pattern in the first metal layer, and multiple electrical contacts between the patterns in the first metal layer and the upper metal layers, in which the dummy pad is electrically connected to the seal ring.

6 Claims, 2 Drawing Sheets

METHOD OF PREVENTING DIELECTRIC BREAKDOWN OF SEMICONDUCTOR DEVICE AND SEMICONDUCTOR DEVICE PREVENTING DIELECTRIC BREAKDOWN

Exemplary embodiments of this invention were first described in Japanese Application No. 2006-126104, which was filed on Apr. 28, 2006 and is hereby incorporated by reference in its entirety.

BACKGROUND

Internal circuits of a semiconductor device using semiconductor elements, such as memory integrated circuit and logic integrated circuit in microcomputers or liquid crystal display (LCD) devices, are connected to devices external to the semiconductor device, such as a power supply, an LCD device, or various other semiconductor devices that generate control signals through terminals, which may be referred to as a pad electrode or pads. The pads include a bonding pad for connecting a circuit with a bonding wire and a bump pad for connecting a circuit with Chip On Film (COF) or Chip on Glass (COG). The pads are usually located around the outer periphery of the semiconductor device.

Not all the above mentioned pads, which include the bonding pad and the bump pad, connect the internal circuit with the external devices. For instance, a dummy pad, which is not electrically connected to the internal circuit, may be installed in order to maintain layout uniformity of the semiconductor device. The bump pad must be formed almost uniformly in a horizontal plane. Otherwise, the semiconductor device may suffer from defective connections when the semiconductor integrated circuit is mounted on a COF or a COG, because the weight of the semiconductor integrated circuit is not uniformly distributed during the connection process.

With regard to the bonding pad, while it is not required to maintain the layout uniformity of the semiconductor device, the dummy pad is often installed in order to even out the processing in the wafer process. This kind of dummy pad is not connected to the wiring or other signal line connected to the internal circuit. The dummy pad is manufactured by utilizing the top wiring layer and/or the wiring layer directly below the top wiring layer.

Although a protection circuit such as an electrostatic discharge (ESD) is typically installed between a pad and an internal circuit in order to prevent the damage caused by electrostatic discharge or some other types of damage, typically no protection circuit is installed for the dummy pad in the interest of saving space in the layout of the semiconductor device.

In order to solve the above problem, Japanese laid-open patent publication No. 11-233777 (Reference 1) discloses that the dummy terminal, i.e., a dummy pad installed adjacent to an array of input terminals, is electrically connected to a static electricity absorption line through a resistor. According to Reference 1, static electricity is attenuated by the resistor, thus preventing damage to the semiconductor device caused by electrostatic discharge.

SUMMARY

The present invention relates to a method for preventing damage to a semiconductor integrated circuit due to a dielectric breakdown caused by electrostatic charge stored in a dummy pad as a result of static electricity or plasma generated during a manufacturing process of a semiconductor integrated circuit.

Many dummy pads must be proximately located to each other due to various reasons, including, for example, the layout design, the scale of the internal circuit, and the like. Consequently, it is necessary to locate the dummy pads adjacent to each other. When many dummy pads are adjacent to each other, dielectric breakdown may occur due to electrification caused by static electricity and plasma generated during the wafer process, the bump process or the dicing process, which take place after the dummy pads are formed.

Therefore, the dielectric interlayer adjacent to the dummy pads may be destroyed, and the dummy pads may inadvertently contact other wirings. Although the thickness of the insulation film gets thinner and thinner due to the refinement of the half-pitch of the internal circuit, dielectric breakdown is significant in the process after the dummy pads are formed due to a lack of countermeasures against damages caused by the generated static electricity and/or plasma.

As a countermeasure against the above-mentioned dielectric breakdown, Reference 1 discloses electrically connecting the dummy pad to the internal circuit and common terminals such as GND or power supply through a resistor. However, this results in increased electrical noise and undesirable capacitance. It is preferable to avoid electrically connecting the dummy pads to a terminal that is electrically connected to the internal circuit, such as an active pad, or to the internal circuit itself.

Accordingly, an exemplary aspect of the present invention provides a semiconductor device that prevents dielectric breakdown caused by the electrification of the dummy pads without requiring the installation of a protection circuit or transmitting electrical noise to the internal circuit. Another exemplary aspect of the present invention provides a method of manufacturing the above-described semiconductor device.

In order to solve the above-mentioned problem, the present invention provides a semiconductor device comprising: an internal circuit formed on a semiconductor substrate; a dummy pad which is not electrically connected to the internal circuit, but is electrically connected to a seal ring. The seal ring surrounds the internal circuit and the dummy pad, where the seal ring is electrically connected to the semiconductor substrate and includes a pattern in a first metal layer, a contact between the pattern in the first metal layer and the semiconductor substrate, patterns in a plurality of upper metal layers stacked above the pattern in the first metal layer, and a plurality of contacts between the patterns in the first metal layer and the plurality of upper metal layers.

In order to solve the above-mentioned problem, the present invention also provide a method of preventing a defect of a semiconductor device caused by an electrostatic charge stored in a dummy pad, comprising: forming an internal circuit of the semiconductor device on the semiconductor substrate; forming a dummy pad which is not electrically connected to the internal circuit; forming a seal ring that surrounds the internal circuit and the dummy pad, where the seal ring is electrically connected to the semiconductor substrate and includes a pattern in a first metal layer, a contact between the pattern in the first metal layer and the semiconductor substrate, patterns in a plurality of upper metal layers stacked above the pattern in the first metal layer, and a plurality of contacts between the patterns in the first metal layer and the plurality of upper metal layers; and electrically connecting the dummy pad to the seal ring so that electrical charge in the dummy pad may flow to the semiconductor substrate through the seal ring.

According to the present invention, the electricity generated in the dummy pad dissipates into the silicon substrate through the seal ring by connecting the dummy pad to the seal ring, which is electrically connected to the silicon substrate on which the internal circuit is formed. By the present invention, it is possible to prevent dielectric breakdown of a semiconductor device caused by the plasma or the static electricity generated during the wafer process, the bumping process, the dicing process, and/or the bonding process after the pad is formed.

DETAILED DESCRIPTION OF EMBODIMENTS

The present invention discloses a semiconductor device containing one or more dummy pads surrounded by a seal ring and electrically connected to the seal ring, which prevents dielectric breakdown caused by the electrification of the dummy pads.

Figure 1:
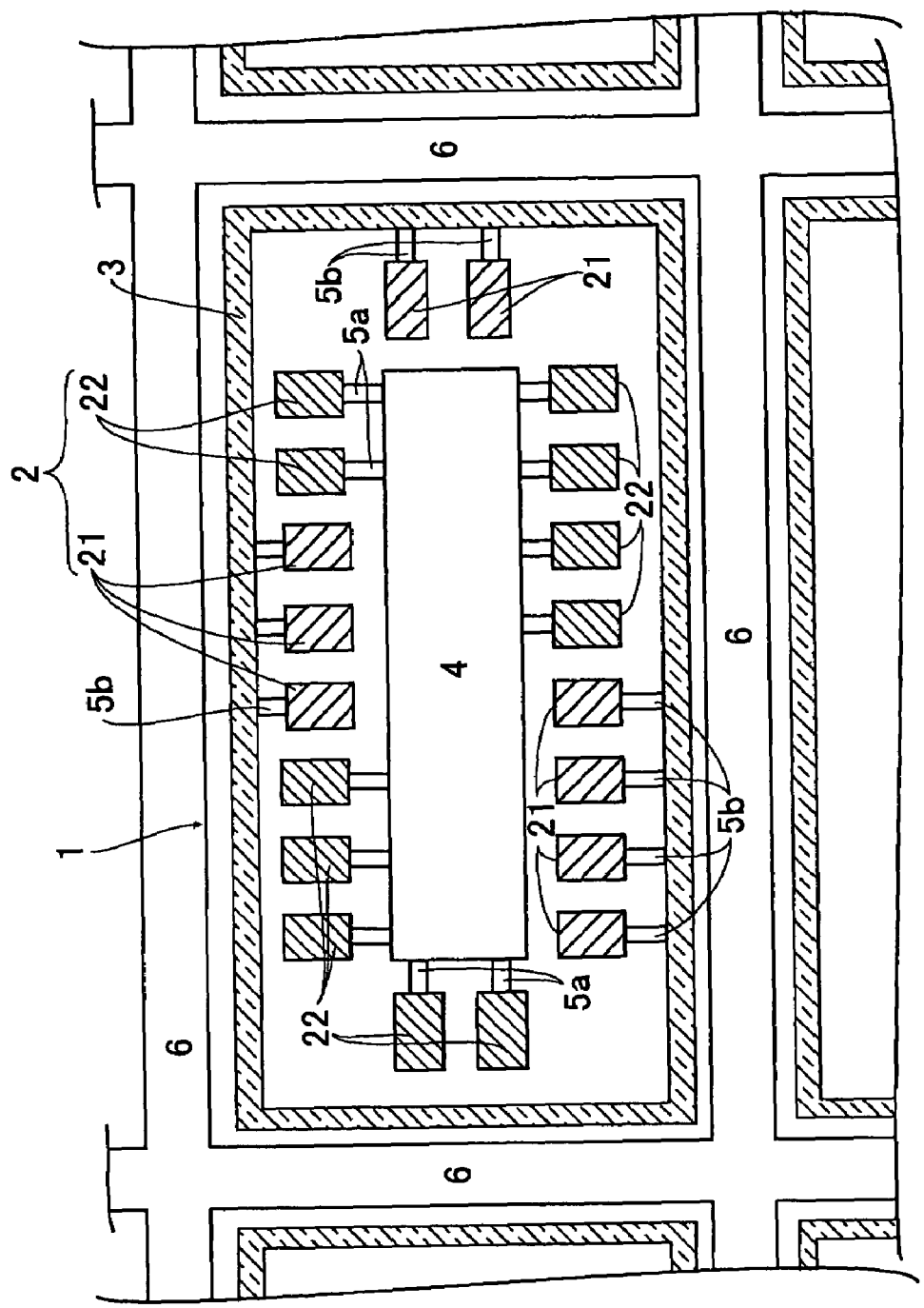
FIG. 1 is a plain view showing a frame format of an exemplary semiconductor device of the present invention.

FIG. 1 is a plain view showing a frame format of an exemplary semiconductor device 1 of the present invention, which is shaped as a chip and is used as a driver. FIG. 1 provides a detailed illustration of semiconductor device 1, which is one of multiple semiconductor devices manufactured on a silicon wafer. In semiconductor device 1, a seal ring 3, a plurality of pads 2 and an internal circuit 4 are sequentially arranged from the outer periphery to the inner periphery of semiconductor device 1. Pad 2 may be classified into two types. The first type includes active pads 22, which are electrically connected to internal circuit 4. The second type includes dummy pads 21, which are not electrically connected to internal circuit 4. Dummy pads 21 are surrounded by seal ring 3.

Active pads 22 and internal circuit 4 are electrically connected via wiring 5a. In FIG. 1, exemplary pads 2 are used to illustrate an embodiment of the present invention, but many more pads may be arranged in a typical semiconductor device (e.g., semiconductor device 1). Multiple scribe lines 6 may be arranged at a boundary area between two adjacent semiconductor devices. Each semiconductor device (e.g., semiconductor device 1) is independently separated by cutting scribe lines 6 in a dicing process.

Internal circuit 4 includes a plurality of semiconductor elements, and is placed near the center of semiconductor device 1. Through active pads 22, internal circuit 4 receives the power supply and various signals (e.g., control signal, input signal, and the like) from devices external to semiconductor device 1. In internal circuit 4, the required data-processing is processed, and the result of the data-processing is output to the external devices through active pads 22.

The plain view of seal ring 3 is shaped like a ring. Seal ring 3 is often installed at the outer periphery of semiconductor device 1. It may also be called a guard ring. An example of a cross sectional view of seal ring 3 is shown in FIG. 2.

Figure 2:
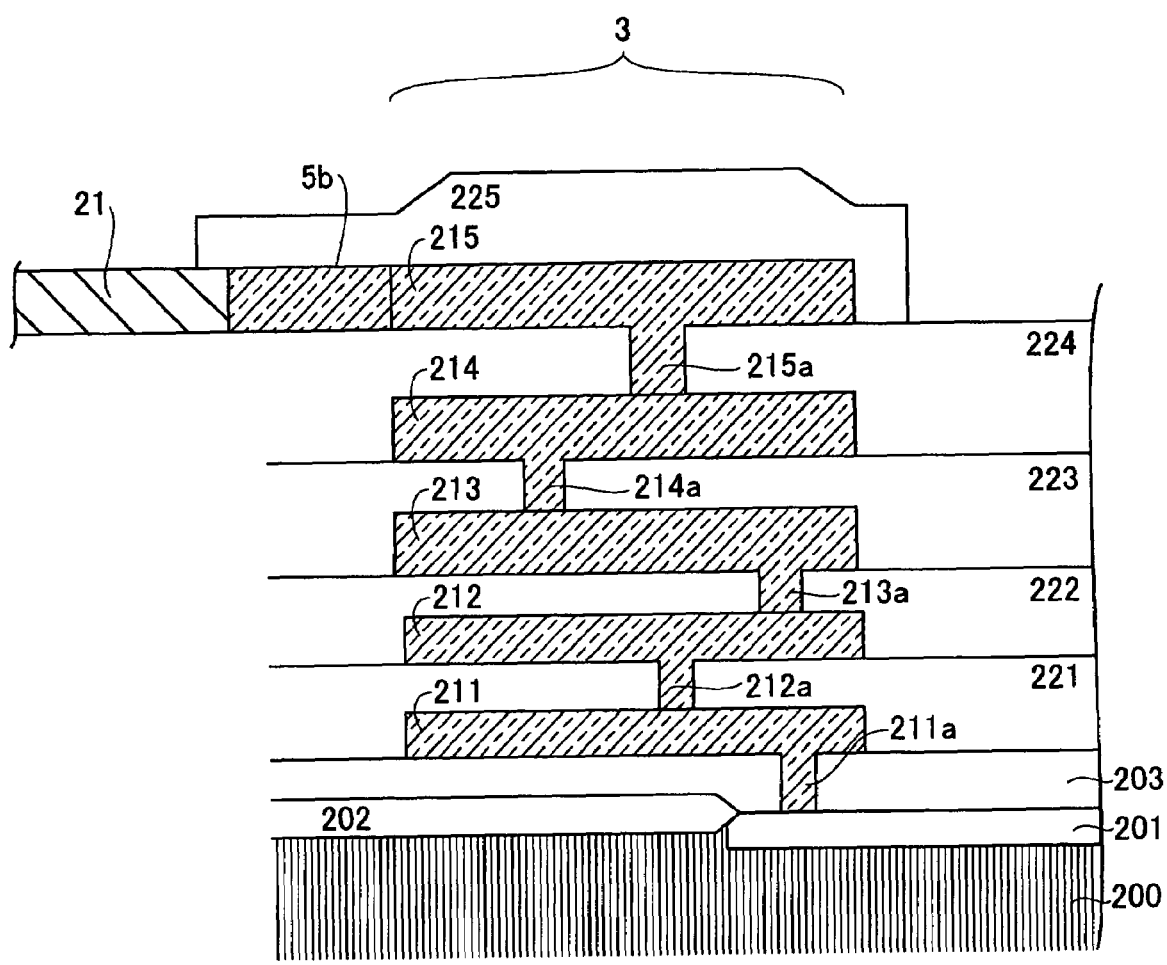
FIG. 2 is a sectional view showing a frame format of an exemplary seal ring of the present invention.

In an exemplary embodiment as illustrated in FIG. 2, seal ring 3 includes the following layers. A silicon substrate 200 is arranged as a bottom layer of seal ring 3. A diffusion layer 201, an insulation film 202, a first insulation layer 203, a pattern 211 in a first metal layer, a second insulation film 221, a pattern 212 in a second metal layer, a third insulation film 222, a pattern 213 in a third metal layer, a fourth insulation film 223, a pattern 214 in a fourth metal layer, a fifth insulation layer 224, a pattern 215 in a fifth metal layer, and a passivation layer 225 are respectively layered over silicon substrate 200.

Pattern 211 in the first metal layer and diffusion layer 201 are connected via a contact 211a. Further, as illustrated in FIG. 2, patterns in the metal layers are connected through contacts 212a-215a. As a result, pattern 215 in the top (fifth) metal layer is electrically connected to silicon substrate 200.

Seal ring 3 serves as a protective barrier when scribe line 6 are cut during the dicing process. That is, even if the edge of semiconductor device 1 cracks as a result of mechanical stress from the dicer, the crack is stemmed at the end of seal ring 3, and the crack does not reach to the area of pads 2 or internal circuit 4. Therefore, the width of seal ring 3 does not depend on the design rule of semiconductor device 1. In an exemplary embodiment, seal ring 3 has a width of approximately 10 µm.

In the exemplary arrangement shown in FIG. 1, seal ring 3 surrounds internal circuit 4 and pads 2, which include dummy pads 21 and active pads 22, are arranged between internal circuit 4 and seal ring 3. Furthermore, dummy pads 21 are arranged adjacent to seal ring 3 and are electrically connected to seal ring 3 by wiring 5b. Because seal ring 3 is electrically connected to silicon substrate 200, which is electrically connected to the GND potential, the potential of seal ring 3 is equal to the GND potential. Therefore, the potential of dummy pads 21, which are connected to seal ring 3, is also equal to the GND potential.

When dummy pads 21 are proximately located, they may be electrostatically charged to a significantly high potential if not connected to seal ring 3. This results in a high possibility of dielectric breakdown in one or more of insulating films 203 and 221-224. In the exemplary arrangement shown in FIG. 1, however, dummy pads 21 are connected to silicon substrate 200 through seal ring 3. Accordingly, electric charges that might be stored in dummy pads 21 would readily flow into silicon substrate 200, which is kept at the GND potential, through seal ring 3 having a sufficiently low resistance.

Furthermore, seal ring 3 has sufficient capacitance because the width of seal ring 3 is usually about 10 µm. Therefore, electrostatic charge built up in dummy pads 21 would momentarily flow to seal ring 3, and then to silicon substrate 200. Accordingly, no dielectric breakdown would occur in any of the insulation films (e.g., first insulating film 203 and second to fifth insulation films 221-224).

Because seal ring 3 is installed to keep semiconductor device 1 from being destroyed by mechanical damage caused by the dicing process, seal ring 3 does not participate in the operation of internal circuit 4. Therefore, dummy pads 21, even when connected to seal ring 3, do not interfere with the operation of internal circuit 4. Moreover, because seal ring 3 has sufficient capacitance, and is directly connected to silicon substrate 200, sudden surges of electrostatic discharge are harmlessly attenuated into the GND. Furthermore, the possibility that internal circuit 4 is affected by noise is very low.

The width of each of wiring 5b is generally equal to or less than the width of its associated dummy pad among dummy pads 21, and is preferably about several tens of µm. Also, materials used to form wiring 5b are those commonly used in semiconductor device 1 having sufficiently low resistance as to not restrict the movement of electrons. It is preferable for the manufacturing process if the conductive material is generally used in the production of the semiconductor devices.

Dummy pads 21 may be electrically connected to seal ring 3 by modifying one layer of the mask used in the existing products. The top metal layer (e.g., the fifth metal layer) or the layer immediately below the top metal layer (e.g., the fourth metal layer) as shown in FIG. 2 may serve as a modifying layer. Wirings for the power supply, the GND, or various kinds of signals are usually placed beneath pads 2. Therefore, pads 2 are often formed using the same mask used to form the top metal layer or the layer immediately below the top metal layer. FIG. 2 shows an example of forming dummy pads 21 and wiring 5b using the same mask used to form the fifth metal layer. The present embodiment as shown in FIG. 2 may be formed by changing only the mask used to form the fifth metal layer. That is, it is possible to achieve the present invention with minimal increase in manufacturing costs because as few as one mask needs to be modified.

As explained above, electrostatic charge in dummy pads 21 flows into silicon substrate 200 through seal ring 3 by connecting dummy pads 21 to seal ring 3, which is electrically connected to silicon substrate 200 on which internal circuit 4 is formed. According to the present invention, it is possible to prevent dielectric breakdown of semiconductor device 1 caused by plasma or static electricity generated during the wafer process, the bumping process, the dicing process, and/or the bonding process after pads 2 are formed.

A major dielectric breakdown caused by electrostatic charge stored in dummy pads 21 may occur up to the bonding process. No major dielectric breakdown occurs after the packaging process or under the environment in which semiconductor device 1 is actually used, because other appropriate countermeasures against dielectric breakdown may be employed. Moreover, the present invention may be achieved by changing only the mask for forming the top metal layer or the layer beneath the top metal layer, because dummy pads 21 and seal ring 3 are utilized in the present invention.

Therefore, the present invention can be achieved without adding any new manufacturing process, any area for elements or increasing any extra cost compared with the conventional process. According to the present invention, dummy pads 21 may be connected to seal ring 3 by modifying only one mask.

What is claimed is:

1. A semiconductor device comprising:
   an internal circuit formed on a semiconductor substrate;
   a dummy pad which is not electrically connected to the internal circuit; and
   a seal ring that surrounds the internal circuit and the dummy pad, where the seal ring is electrically connected to the semiconductor substrate and includes a pattern in a first metal layer, a contact between the pattern in the first metal layer and the semiconductor substrate, patterns in a plurality of upper metal layers stacked above the pattern in the first metal layer, and a plurality of contacts between the patterns in the first metal layer and the plurality of upper metal layers,
   wherein the dummy pad is electrically connected to the seal ring.

2. The semiconductor device according to claim 1, wherein the dummy pad includes a plurality of proximately located dummy pads.

3. The semiconductor device according to claim 1, wherein the plurality of upper metal layers includes a top metal layer and a below-the-top metal layer disposed immediately below the top metal layer, where the dummy pad is formed in one of the top and the below-the-top metal layers and is electrically connected to the seal ring through an electrical conductor in the one of the top metal layer and the below-the-top metal layer.

4. A method of preventing a defect of a semiconductor device caused by an electrostatic charge stored in a dummy pad, comprising:
   forming an internal circuit of the semiconductor device on the semiconductor substrate;
   forming a dummy pad which is not electrically connected to the internal circuit;
   forming a seal ring that surrounds the internal circuit and the dummy pad, where the seal ring is electrically connected to the semiconductor substrate and includes a pattern in a first metal layer, a contact between the pattern in the first metal layer and the semiconductor substrate, patterns in a plurality of upper metal layers stacked above the pattern in the first metal layer, and a plurality of contacts between the patterns in the first metal layer and the plurality of upper metal layers; and
   electrically connecting the dummy pad to the seal ring.

5. The method according to claim 4, wherein the dummy pad includes a plurality of proximately located dummy pads.

6. The method according to claim 4, wherein the plurality of upper metal layers includes a top metal layer and a below-the-top metal layer disposed immediately below the top metal layer, where the dummy pad is formed in one of the top and the below-the-top metal layers and is electrically connected to the seal ring through an electrical conductor in the one of the top metal layer and the below-the-top metal layer.

* * * * *